United States Patent [19]

O'Connell et al.

[11] Patent Number: 5,224,071
[45] Date of Patent: Jun. 29, 1993

[54] ADDRESSABLE MEMORY UNIT HAVING AN IMPROVED UNIT SELECTION CIRCUIT

[75] Inventors: Cormac O'Connell, Eindhoven; Leonardus C. M. G. Pfennings, deceased, late of Eindhoven, Henricus J. Kunnen, legal representative; Peter H. Voss, Eindhoven; Thomas J. Davies, Eindhoven; Hans Ontrop, Eindhoven; Cathal G. Phelan, Eindhoven, all of Netherlands

[73] Assignee: U.S. Philips Corp., New York, N.Y.

[21] Appl. No.: 390,326

[22] Filed: Aug. 7, 1989

[30] Foreign Application Priority Data

Aug. 19, 1988 [FR] France ............... 88 11035

[51] Int. Cl.⁵ .............................. G11C 7/00
[52] U.S. Cl. .................... 365/189.04; 365/189.05; 365/230.06; 365/230.08; 371/10.1; 371/10.2; 371/10.3; 307/449; 307/463
[58] Field of Search ............ 365/189.24, 189.05, 365/230.08, 230.06; 371/10.1, 10.2, 10.3; 307/449, 463

[56] References Cited

U.S. PATENT DOCUMENTS

| 4,412,309 | 10/1983 | Kuo ....................................... 365/184 |
| 4,543,647 | 9/1985 | Yoshida .......................... 365/230.08 |
| 4,593,383 | 6/1986 | Armstrong et al. ........... 365/230.08 |
| 4,651,304 | 3/1987 | Takata .................................... 365/201 |
| 4,849,939 | 7/1989 | Muranaka et al. ................. 371/10.1 |
| 4,852,066 | 7/1989 | Kai .................................. 365/230.06 |
| 4,855,621 | 8/1989 | Hoffman et al. ............... 365/230.06 |
| 4,879,681 | 11/1989 | Miwa et al. ..................... 365/189.05 |
| 4,879,689 | 11/1989 | Atsumi et al. .................. 365/189.05 |

OTHER PUBLICATIONS

R. J. Hengst et al, "Address Buffer", IBM Technical Disclosure Bulletin, vol. 26, No. 12, May 1984, pp. 6469-6470.

Primary Examiner—Joseph E. Clawson, Jr.
Attorney, Agent, or Firm—Jack D. Slobod

[57] ABSTRACT

An addressable memory unit has address input buffer circuits which output a pair of output connections on which, in read or write mode, two signals which are complementary to one another are present but which may also adopt equal values in such a manner as to cause a predecoder and line selector to select all or none of the selection lines controlling the cells of the memory accessed.

2 Claims, 2 Drawing Sheets

ADDRESSABLE MEMORY UNIT HAVING AN IMPROVED UNIT SELECTION CIRCUIT

BACKGROUND OF THE INVENTION

1. Field of the Invention

The invention relates to a unit containing a plurality of direct-access random access memory cells, and comprising, inter alia, a unit selection input and a parellel multi-bit input for the address data presented to the unit, equipped with buffer circuits which, for each input bit, possess a pair of output connections on which, in read or write mode, two signals which are complementary to one another are present.

2. Description of the Related Art

It is known form the U.S. Pat. No. 4,412,309 (Kuo) to provide an electrically erasable programmable read only memory (EEPROM) with circuit means in order that two normally complementary signals for an address bit exhibit the same significant state, when a deselection signal is present at the unit selection input. When the two said signals exhibit the same significant state, several rows or columns can be programmed simultaneously. As a result the amount of programming time is reduced. Such a reduction is necessary because otherwise a comparatively large amount of time (measured in seconds) is necessary for programming an EEPROM in relation to the time which is necessary for reading the contents of an EEPROM.

SUMMARY OF THE INVENTION

In the known addressable memory units, the signal originating from the selection input (chip enable or chip select) is customarily supplied to the buffer circuit, but also to the majority of the decoding circuits of the unit, virtually as if a supplementary address bit were involved.

An object, amongst others, of the invention is to reduce the power consumed and to improve the testing capacity. It is based on the idea that, if an address decoder selects a line when it receives on its inputs a set of pairs of complementary signals, it is also possible to consider another illustrative case: that which corresponds to equal signals on the pairs.

A memory according to the invention is thus noteworthy in that the said buffer circuits are equipped with means in order that the two said signals all exhibit the same significant state, in one pair and also from one pair to the other, when a deselection signal is present at the unit selection input.

As there are two different cases in which the two signals are equal, it is advantageous to provide a supplementary input referred to as the general write input, which permits simultaneous writing in a plurality of memory cells, and to equip the buffer circuit with means in order that the two said signals all exhibit the same significant state, in one pair and also from one pair to the other, when the general write input is activated, this status being the inverse of that obtained when a deselection signal is present.

The memory unit according to the invention exhibits multiple advantages which will be explained more easily, at the same time as the implementation of the invention, with the aid of the description which will follow, with reference to the accompanying drawings describing nonlimiting examples.

The present invention differs from U.S. Pat. No. 4,412,309 to Kuo in that it is related to a totally different kind of memory circuits, viz. random access memories (RAM's), which can be written (=programmed) at high speed. So from this point of view reduction of "programming time" does not seem to be necessary. Other objects, like improvement of testability, reduction of power dissipation, etc. are pursued. At the same time also an improvement of speed can be obtained.

DETAILED DESCRIPTION OF THE PREFERRED EMBODIMENTS

Figure 1:
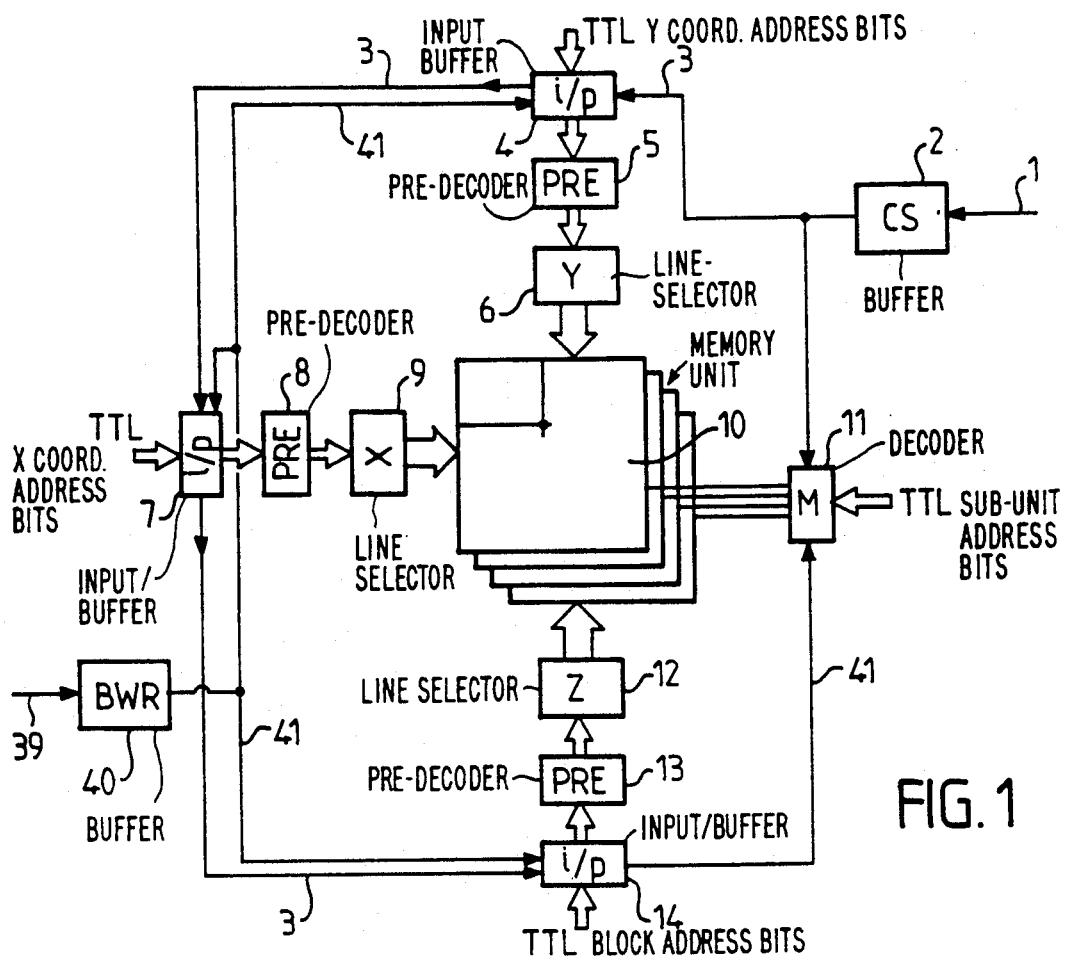
FIG. 1 is a schematic diagram of a general organization of the memory unit in which connections shown in dashed line are eliminated in accordance with the principles of the invention as a result of the structure of address input buffer circuits therein.

The direct-access random access memory unit of FIG. 1 is, in the present example, constructed in complementary MOS or C-MOS technology, and comprises four sub-units 10, each containing a plurality of memory cells. The circuit 11 for the selection of subunits chooses one from among the four subunits as a function of the value of two of the address bits TTL at the input. Each sub-unit is divided into 16 blocks, which are addressed according to a variable indicated by Z, which is decoded on the basis of four of the address bits TTL at the input. The memory cells of each one of the 16 blocks are addressed by X, Y coordinate.

Each one of the selection circuits Z, X, Y, is organized in the same way: it comprises an address input buffer circuit i/p, 14, 7, 4 respectively, a predecoding circuit 13, 8, 6 respectively, and a line selection circuit 12, 9, 6 respectively.

A unit selection signal CS is passed on the input 1 to the buffer circuit 2, and then via the connections 3 (and in accordance with the prior art) to the various circuits of the unit. Similarly, a general write signal BWR is passed on the input 39 to the buffer circuit 40 than via connections 41 to various circuits of the unit. The general diagram which has just been described is given on a functional basis, amoung other things, to support the description of the advantages of the invention. As will become apparent as the discussion proceeds, one feature of the invention is the elimination of connections 38.

Figure 2:
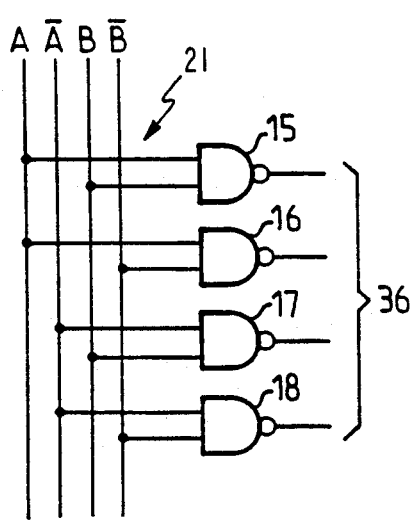
FIG. 2 is an example of a circuit used in the predecoder of FIG. 1.

Each one of the address input buffer circuits 4, 7, 14, which will be later described in more detail, comprises a parallel input for address bits presented to the unit, and, for each bit, a pair of connections for, in normal read or write mode, the presentation of two complementary signals A, $\overline{A}$ or alternatively B, $\overline{B}$, etc. to predecoding circuits 13, 8, 5 respectively, which form a part of each predecoding circuit comprises a selection element 21 of the demultiplexer type, as illustrated in FIG. 2 which chooses one line from among four as a function of the value of two input bits indicated by A and B, as well as the respective complementary signals $\overline{A}$ and $\overline{B}$. It comprises four NAND gates 15-18, the pairs of inputs of which are connected respectively to A, B, to A, $\overline{B}$, to $\overline{A}$, B, and to $\overline{A}$, $\overline{B}$, and the outputs of which are the lines 36 to be selected. IT is easy to verify that, for each one of the four possible configurations for the pair A, B, a single line is selected (with a low logic level).

Figure 3:
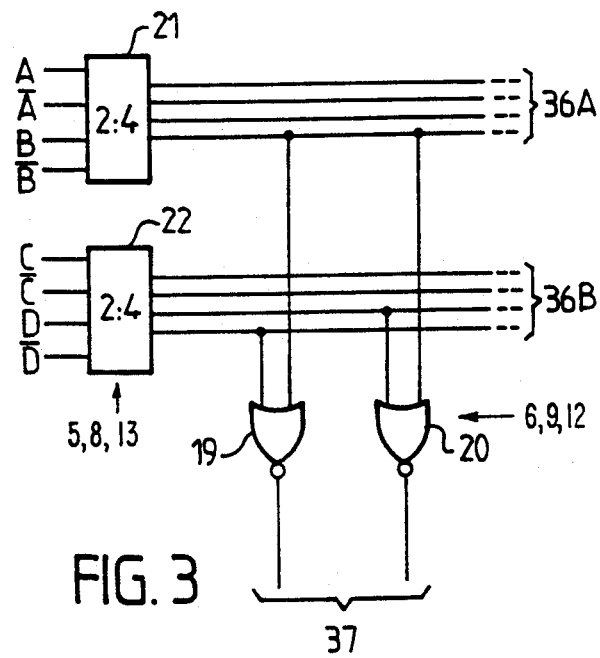
FIG. 3 is an example of a decoding circuit comprising a predecoder and line selector utilizing circuits of the type of that of FIG. 2, wherein, as in FIG. 1, the dashed connections are eliminated in accordance with the principles of the invention.

In order to select sixteen lines, the circuit of FIG. 3 utilizes an element 21, of the type represented in FIG. 2, with two inputs A and B and a second identical element 22 with two inputs C, D. There are therefore two groups of four lines 36A, 36B, with one selected line (low state) per group. To these liens are connected sixteen NOR gates, only two 19, 20 of which are represented, in order to simplify the figure. Two inputs of each one of these sixteen gates are each connected to a line of one of the two groups 36; the gates 19,20, etc. are, of course, connected to one pair of lines, which is different on each occasion. Only one of the outputs of the NOR gates is therefore in the high logic state, in normal read or write mode. This circuit illustrates, for example, the content of the element 12 of FIG. 1, which selects one from among sixteen blocks.

The X and Y circuits, 9 and 6, are based on the same principle with more complex selectors to choose one X line and one Y line in each block. It is easily possible to envisage such extensions of the selectors: for example, by constructing the circuit of FIG. 2 with NAND gates of three inputs and with three inputs A, B, C, the selection of one line from among eight would be performed as a function of three bits.

It is also possible to contemplate, by way of a variant, the constitution of the elements of FIG. 2 with NOR gates ;this would place only the selected line in the high state, and the circuit of FIG. 3 would then be constructed with NAND or AND gates.

The circuit of FIG. 3 corresponds to the prior art with the unit selection signal $\overline{CS}$ passed to each one of the sixteen gates 19, 20 etc. of FIG. 3 and also to all the similar gates (not shown) of the other selection circuits, in such a manner as to deselect all the lines (in order to avoid consuming current), even if an address continues to be presented to the input of the unit (if $\overline{CS}$ is at 1, all the outputs of the gates 19, 20, . . . are at O). In the present invention the unit selection signal $\overline{CS}$ is not passed to the sixteen gates 19, 20 etc. Instead, the buffer circuits 4, 7, 14 are equipped with means in order that the two signals A, $\overline{A}$ should exhibit the same high or low state, and that the signals B, $\overline{B}$ should also exhibit the same state, and likewise for all the pairs of signals, when a deselection signal is present at the input of the unit, that is to say, in this case, when CS is at zero.

In the example of FIG. 2, where the predecoding circuit is constructed with NAND gates, the state in question of the pairs A, $\overline{A}$ or B, $\overline{B}$, etc. must be the low state. In these circumstances, no line is selected: all the gates 15 to 18 have their outputs in the high state. In the case of the variant where the predecoding circuit is constructed with NOR gates, the state of the pairs $\overline{A}$, A or B, B, etc., must be the high state. In these circumstances, all the NOR gates have their outputs int he low state and no line is selected. It does, of course, follow that none of the lines 37 of FIG. 3 is selected any longer, and it becomes of no avail to pass the connection $\overline{CS}$ to all the NOR gates of FIG. 3. The connections 38 of FIG. 1 disappear.

This exhibits a two-fold advantage: this simplifies the topography by eliminating a connection which serves numerous points, and moreover each one of the gates 19, 20, etc., has one input fewer and can be constructed on a smaller surface and, as a result of this, is faster (less parasitic capacitances).

Furthermore, in the prior art, when a change of address is made at the same time as the unit is selected, the signal CS arrives immediately via the connection 38 (FIG. 1) on the elements 6, 9, 12. The address selectors activate intermediate circuit elements and, as a result of this, the selection of addresses is carried out only with a small delay in relation to the signal CS. During this delay time, it was possible for a false address to be used, and for a false data item to be supplied at the output. In order to avoid this, a serial delay was introduced in the connection 38. With the invention, this delay no longer exists and the circuit is faster.

Another advantage is that, if there is a change of address during the deselection, nothing takes place in the circuits 5, 6, 8, 9, 13, 12 until the subsequent selection, while in the prior art there was then a consumption of current (in C-MOS, it is the transition which consume energy). Moreover, on the occasion of the subsequent reselection, it is only one of the two lines A or $\overline{A}$ which must change state in order to modify an address bit, instead of two in the prior art. This fact procures an advantage: on account of the fact that the number of gates which are to flip in the course of a change of address is diminished by one half, the demand for current is smaller in the course of the transition, the ground or supply voltage surges which result therefrom are smaller, and the operation is therefore more reliable.

The reliability is also improved on account of the fact that the number of transistors is reduced in the gates 19, 20, etc.

There are also fewer situations of "competition" between signals, one of which must obligatorily arrive before the other, and on account of this fact there are fewer sensitive situations involving a risk of causing anomalies int he event of a discrepancy as to the physical characteristics resulting from dispersions in the production process.

Apart from the state $A=\overline{A}=0$, the application of which has been described hereinabove, there are, of course, the states $A=1/\overline{A}=0$ and $A=0/\overline{A}=1$, which are the normal states encountered in the read or write mode and which each represent the state of one address bit; there is also the state $A=\overline{A}=1$, which is "abnormal". It is advantageous to use this state to define a useful situation.

To this end, the unit comprises an input referred to as the general write input, under the control of which it is possible to write simultaneously in a plurality of memory cells. This input is, in every respect, similar to the input CS with its input buffer circuit 40 and an access 41 to all the address buffer circuits 4, 7, 14.

Each one of the buffer circuits is equipped with means in order that the pair of signals A, $\overline{A}$ and the pair B, $\overline{B}$ and all the other pairs should be in the same logic state, which is the inverse of that which corresponds to the deselection, when the general write input is activated. In the present case, this stage is $A=\overline{A}=1$. In these circumstances, all the lines corresponding to all the cells are activated. This permits writing in all the cells at once, and the performance, for example, of a simultaneous resetting to zero of the entire memory unit.

Figure 4:
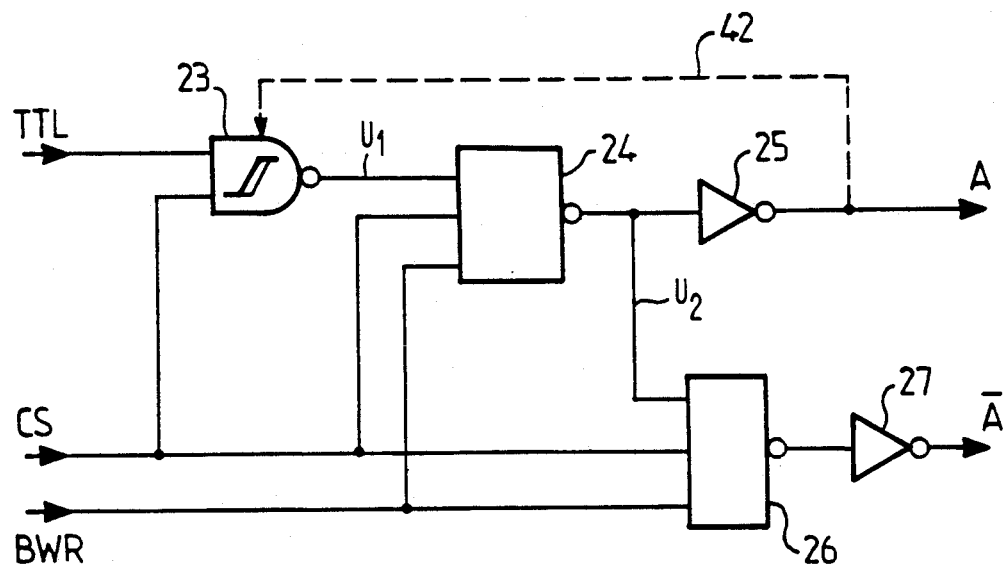
FIG. 4 is a structural diagram of the address input buffer circuit according to the invention.

FIG. 4 represents a preferred embodiment of an address input buffer circuit element, this element corresponding to one bit. The circuits 4, 7, 14 of FIG. 1 do of course, comprise as many times the circuit of FIG. 4 as there are parallel bits at their input.

An address bit, for example with a level referred to as TTL (low level: 0.8 volt, high level: 2.4 volts), is provided on a TTL input of the NAND gate 23, the signal CS being supplied at its other input. The output of the gate 23 is connected to an upper (as shown in the drawings) input of the element 24 while the output of element 24 is connected to a similar upper input U2 of element 26. The two elements 24 and 26 are identical. The selection signal CS is passed to the central input of each of the elements 24 and 26, and the general write signal BWR is passed to the lower input each of elements 24, 26. The output of the element 24 is connected to the upper input of the drawing of the element 26. Finally, the outputs of the two elements 24 and 26 supply the signals A and $\overline{A}$ respectively, each via an inverter 25, 27 respectively.

A broken line 42 symbolizes a feedback which causes a hysteresis effect, and does not form part of the invention.

Figure 5:
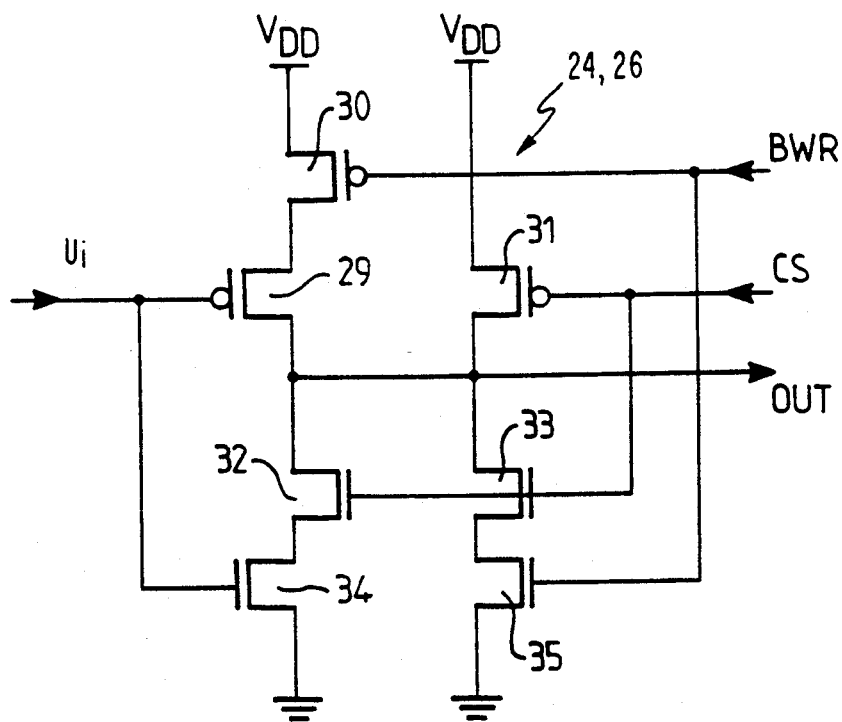
FIG. 5 is a detailed diagram of one of the elements 24 or 26 of FIG. 4.

One of the identical elements 24 or 26 is represented by FIG. 5. The references Ui, CS, BWR indicate respectively the inputs referred to hereinabove as the upper, central and lower inputs.

There is a NAND gate with Ui and CS as inputs, which is constituted in a known manner by the two P-channel transistors 29, 31 in parallel between the supply VDD and the output OUT, and two N-channel transistors 32, 34 in series between ground and the output, but to which two transistors controlled by the signal BWR are added:
a P-channel transistor 30 in series with the transistor 29,
a N-channel transistor 35, connected in series with a N-channel transistor 33 controlled by CS between the output OUT and ground.

IT is found that:
If CS=0 it follows that OUT=1, irrespective of Ui and BWR.
If CS=1 and BWR=Ui=0, it follows that OUT=1 as well.
If CS=1 and Ui=1, or alternatively if CS=1 and BWR=1, it follows that OUT=0, irrespective of the state of the third input.

Applying these results to the circuit of FIG. 4, it is found that:
If CS=0, it follows that A=$\overline{A}$=0, irrespective of BWR and TTL.
If CS=1 and BWR=1, it follows that A=$\overline{A}$=1, irrespective of TTL.
If CS=1 and BWR=0, A and $\overline{A}$ are complementary and A=TTL.

The circuit of FIG. 4 thus constitutes a means for supplying the states according to the invention for the signals A and $\overline{A}$.

If it is desired to use the invention only with regard to CS and not BWR, it is sufficient to replace each one of the elements 24 or 26 by a simple NAND gate with two inputs, these two inputs being connected in the manner of the upper and central inputs of the elements 24, 26.

What is claimed is:

1. A memory access system for accessing a memory unit composed of a plurality of random access memory cells having selection line inputs for selecting said memory cells thereof for access, said access system comprising:
   address receiving means for receiving parallel address data bits indicating a memory cell location for a read or write individual access operation;
   a general write signal receiving means for receiving a general write signal indicating whether or not all memory cells of said unit are to be written simultaneously as a general access operation;
   unit selection signal receiving means for receiving a signal indicating whether or not said unit is selected for either an individual or a general access operation;
   buffer circuit means responsive to said address receiving means, said unit selection signal receiving means and said general write signal receiving means for forming two output signals for each address data bit, which, which said unit selection signal indicates said unit is not selected, said two output signals have first predetermined equal states, when said general write signal indicates that all memory cells of said unit are to be accessed simultaneously and said unit selection signal indicates said unit is selected, said two output signals have second predetermined equal states opposite to said first predetermined equal states, and when said unit selection signal indicates said unit is selected and said general write signal does not indicate that all memory cells of said unit are to be written simultaneously, a predetermined one of said two output signals has the same state as the address data bit associated with said output signals, and the other one of said two output signals has a state which is the complement of the state of the predetermined one of the output signals, and
   decoder means responsive to said two output signals for each address data bit for feeding said selection lines of said memory.

2. A system as claimed in claim 1 wherein said decoder means comprises a comprises a predecoder means comprising a plurality of first gates of the same type as each other, each receiving a different combination of said two output signals for each data bit and a line selector means comprising a plurality of second gates of the same type as each other, each second gate fed by a different combination of output form said first gates and feeding a different one of said selection lines.

* * * * *